(12) United States Patent
Boutwell et al.

(10) Patent No.: US 7,351,482 B2
(45) Date of Patent: Apr. 1, 2008

(54) CERAMIC COMPOSITIONS FOR THERMAL BARRIER COATINGS STABILIZED IN THE CUBIC CRYSTALLINE PHASE

(75) Inventors: Brett Allen Boutwell, Liberty Township, OH (US); Mark Daniel Gorman, West Chester, OH (US); Irene Spitsberg, Loveland, OH (US); Ramgopal Darolia, West Chester, OH (US); Robert William Bruce, Loveland, OH (US); Venkat Subramaniam Venkataramani, Clifton Park, NY (US)

(73) Assignee: General Electric Company, Schnectady, NY (US)

( * ) Notice: Subject to any disclaimer, the term of this patent is extended or adjusted under 35 U.S.C. 154(b) by 0 days.

(21) Appl. No.: 11/288,366

(22) Filed: Nov. 29, 2005

(65) Prior Publication Data

US 2006/0216534 A1   Sep. 28, 2006

Related U.S. Application Data

(63) Continuation of application No. 10/748,517, filed on Dec. 30, 2003, now abandoned.

(51) Int. Cl.
*C04B 35/48* (2006.01)
*B32B 18/00* (2006.01)
*B32B 15/04* (2006.01)

(52) U.S. Cl. .................. 428/702; 428/697; 428/699; 428/701; 501/103; 501/104

(58) Field of Classification Search .................. None
See application file for complete search history.

(56) References Cited

U.S. PATENT DOCUMENTS 3,432,314 A * 3/1969 Lynch et al. ................. 501/103

(Continued)

OTHER PUBLICATIONS

Hwang et al., "Grain Size Control of Tetragonal Zirconia Polycrystals Using the Space Charge Concept", J. Am. Ceram. Soc., 1990, 73(11):3269-77.

(Continued)

*Primary Examiner*—Jennifer C. McNeil
*Assistant Examiner*—Jason Savage
(74) *Attorney, Agent, or Firm*—Marcella R. Louke; William Scott Andes

(57) ABSTRACT

Zirconia-containing ceramic compositions that are capable of providing thermal barrier coatings wherein the zirconia is stabilized in the cubic crystalline phase. These compositions comprise at least about 50 mole % zirconia and a stabilizing amount up to about 49 mole % of a stabilizer component comprising: (1) a first metal oxide selected from the group consisting of ytterbia, neodymia, mixtures of ytterbia and neodymia, mixtures of ytterbia and lanthana, mixtures of neodymia and lanthana, and mixtures of ytterbia, neodymia and lanthana in an amount of from about 5 to about 49 mole % of the composition; and (2) a second metal oxide selected from the group consisting of yttria, calcia, ceria, scandia, magnesia, india and mixtures thereof in an amount of about 4 mole % or less of the composition. The ceramic composition further comprises one or more of a third metal oxide selected from the group consisting of: (a) hafnia in an amount from about 0.5 to about 40 mole % of the composition; and (b) tantala in an amount of from about 0.5 to about 10 mole % of the composition. These compositions are useful in preparing thermal barrier coatings for an underlying substrate of articles that operate at, or are exposed to, high temperatures.

27 Claims, 1 Drawing Sheet

U.S. PATENT DOCUMENTS

| | | | |
|---|---|---|---|
| 3,620,781 | A | 11/1971 | Garvie |
| 4,360,598 | A | 11/1982 | Otagiri et al. |
| 4,485,151 | A | 11/1984 | Stecura |
| 4,639,356 | A | 1/1987 | O'Toole et al. |
| 4,753,902 | A | 6/1988 | Ketcham |
| 4,880,614 | A * | 11/1989 | Strangman et al. ......... 428/623 |
| 5,180,696 | A | 1/1993 | Inoue |
| 5,350,599 | A | 9/1994 | Rigney et al. |
| 5,384,200 | A | 1/1995 | Giles et al. |
| 5,705,231 | A | 1/1998 | Nissley et al. |
| 5,789,330 | A | 8/1998 | Kondo et al. |
| 5,817,372 | A * | 10/1998 | Zheng ......... 427/456 |
| 5,824,089 | A | 10/1998 | Rieger |
| 5,942,334 | A | 8/1999 | Wortman |
| 5,981,088 | A | 11/1999 | Bruce et al. |
| 6,025,078 | A | 2/2000 | Rickerby et al. |
| 6,054,184 | A | 4/2000 | Bruce et al. |
| 6,117,560 | A | 9/2000 | Maloney |
| 6,123,997 | A | 9/2000 | Schaeffer et al. |
| 6,183,884 | B1 | 2/2001 | Rickerby |
| 6,284,323 | B1 | 9/2001 | Maloney |
| 6,319,614 | B1 | 11/2001 | Beele |
| 6,333,118 | B1 | 12/2001 | Alperine et al. |
| 6,352,788 | B1 | 3/2002 | Bruce |
| 6,387,526 | B1 | 5/2002 | Beele |
| 6,395,381 | B1 | 5/2002 | Kondo et al. |
| 6,458,473 | B1 * | 10/2002 | Conner et al. ............. 428/623 |
| 6,465,090 | B1 | 10/2002 | Stowell et al. |
| 6,812,176 | B1 * | 11/2004 | Zhu et al. ................ 501/102 |
| 6,858,334 | B1 | 2/2005 | Gorman et al. |
| 6,869,703 | B1 | 3/2005 | Spitsberg et al. |
| 6,875,529 | B1 | 4/2005 | Spitsberg et al. |
| 6,887,595 | B1 | 5/2005 | Darolia et al. |
| 6,916,561 | B1 | 7/2005 | Spitsberg et al. |
| 6,924,040 | B2 * | 8/2005 | Maloney .................... 428/472 |
| 6,960,395 | B2 | 11/2005 | Spitsberg et al. |
| 2002/0172838 | A1 | 11/2002 | Rigney et al. |
| 2003/0049470 | A1 | 3/2003 | Maloney |
| 2003/0059633 | A1 | 3/2003 | Ackerman et al. |
| 2003/0224200 | A1 | 12/2003 | Bruce |

OTHER PUBLICATIONS

Kim, "Effect of $Ta_2O_5$, $Nb_2O_5$, and $HfO_2$ Alloying on the Transformability of $Y_2O_3$-Stabilized Tetragonal $ZrO_2$", J. Am. Ceram. Soc., 73(1):115-120.

Nakayama et al., "Effect of $La_2O_3$ Addition on Thermal Stability of Y-TZP," J. Mat. Sci. Lett., 18:1339-41 (1999).

Vassen et al., "Zirconates as New Materials for Thermal Barrier Coatings," J. Am. Ceram. Soc., 83(8):2023-28 (2000).

U.S. Appl. No. 10/748,516, filed Dec. 30, 2003, Gorman et al.
U.S. Appl. No. 10/748,519, filed Dec. 30, 2003, Darolia et al.
U.S. Appl. No. 10/748,508, filed Dec. 30, 2003, Spitsberg et al.
U.S. Appl. No. 10/748,520, filed Dec. 30, 2003, Spitsberg et al.
U.S. Appl. No. 10/748,521, filed Dec. 30, 2003, Spitsberg et al.
U.S. Appl. No. 10/748,518, filed Dec. 30, 2003. Spitsberg et al.
U.S. Appl. No. 10/748,513, filed Dec. 30, 2003, Spitsberg et al.

* cited by examiner

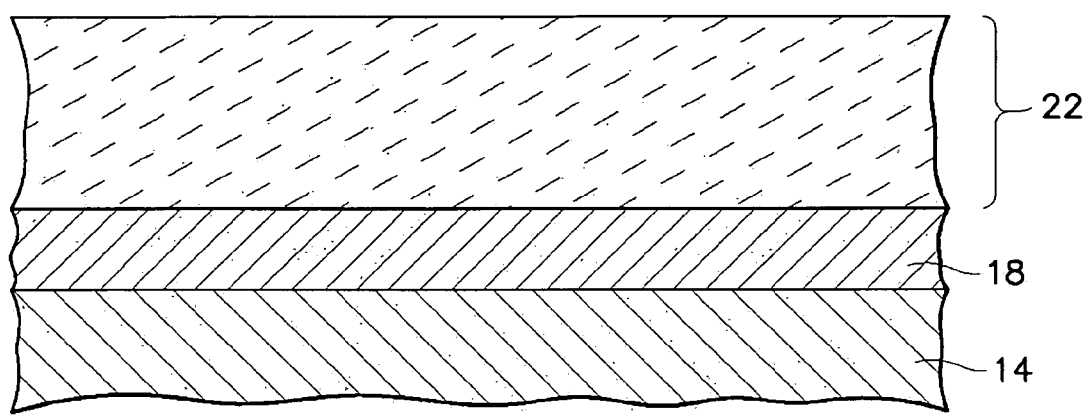

CERAMIC COMPOSITIONS FOR THERMAL BARRIER COATINGS STABILIZED IN THE CUBIC CRYSTALLINE PHASE

CROSS-REFERENCE TO RELATED APPLICATIONS

This application is a continuation of Non-Provisional U.S. application Ser. No. 10/748,517 filed Dec. 30, 2003, now abandoned. The entire disclosure and contents of the above non-provisional patent application is hereby incorporated by reference.

STATEMENT REGARDING FEDERALLY SPONSORED RESEARCH

This invention was made with Government support under Contract No. N00421-00-3-0443 awarded by the Office of Naval Research. The Government has certain rights to the invention.

BACKGROUND OF THE INVENTION

This invention relates to zirconia-containing ceramic compositions for thermal barrier coatings having reduced thermal conductivity that comprise a stabilizer metal oxide selected from ytterbia, neodymia or mixture thereof, with or without lanthana, to stabilize the zirconia in the cubic crystalline phase. This invention also relates to ceramic compositions comprising zirconia and these stabilizer metal oxides that additionally comprise hafnia for balancing the conductivity of the resultant coating, and/or tantala to contribute additional conductivity reductions. This invention further relates to coatings prepared from such compositions, articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coatings are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine airfoils such as blades and vanes, turbine shrouds, combustion liners, deflectors, and the like. These thermal barrier coatings typically comprise the external portion or surface of these components and are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

For reduced thermal conductivity, the thermal barrier coating is usually prepared from a ceramic material, such as zirconia. It is also desirable to chemically phase-stabilize the zirconia-containing thermal barrier coating in the cubic phase. The cubic phase is desirable for lower thermal conductivity and can be either fluorite or pyrochlore structure. Examples of such chemically phase-stabilized zirconias include yttria-stabilized zirconia, scandia-stabilized zirconia, ceria-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia.

There are a variety of ways to further reduce the thermal conductivity of such thermal barrier coatings. One is to increase the thickness of the coating. However, thicker thermal barrier coatings suffer from weight and cost concerns. Another approach is to reduce the inherent thermal conductivity of the coating. One effective way to do this is to provide a layered structure such as is found in thermal sprayed coatings, e.g., air plasma spraying coatings. However, coatings formed by physical vapor deposition (PVD), such as electron beam physical vapor deposition (EB-PVD), that have a columnar structure are typically more suitable for turbine airfoil applications (e.g., blades and vanes) to provide strain tolerant, as well as erosion and impact resistant coatings.

Another general approach is to make compositional changes to the zirconia-containing ceramic composition used to form the thermal barrier coating. A variety of theories guide these approaches, such as: (1) alloying the zirconia lattice with other metal oxides to introduce phonon scattering defects, or at higher concentration levels, to provide very complex crystal structures; (2) providing "coloring agents" that absorb radiated energy; and (3) controlling the porosity and morphology of the coating. All of these approaches have limitations. For example, modifying the zirconia lattice, and in particular achieving a complex crystal structure, limits the potential options for chemical modification and can interfere with good spallation resistance and particle erosion resistance of the thermal barrier coating.

Accordingly, it would be desirable to be able to change the compositional parameters of the zirconia-containing ceramic composition to achieve further reductions in the thermal conductivity of the resultant thermal barrier coating, yet still be able to stabilize the zirconia in the cubic crystalline phase. It would further be desirable to be able stabilize the zirconia in the cubic crystalline phase without needing to include traditional phase stabilizers for zirconia such as yttria.

BRIEF DESCRIPTION OF THE INVENTION

An embodiment of this invention relates to zirconia-containing ceramic compositions for preparing a thermal barrier coating for an underlying substrate of articles that operate at, or are exposed to, high temperatures. These compositions are capable of providing thermal barrier coatings wherein the zirconia is stabilized in the cubic crystalline phase, and comprise:

1. at least about 50 mole % zirconia; and
2. a stabilizing amount up to about 49 mole % of a stabilizer component comprising:
   a. a first metal oxide selected from the group consisting of ytterbia, neodymia, mixtures of ytterbia and neodymia, mixtures of ytterbia and lanthana, mixtures of neodymia and lanthana, and mixtures of ytterbia, neodymia and lanthana in an amount of from about 5 to about 49 mole % of the composition;
   b. about 4 mole % or less of a second metal oxide selected from the group consisting of yttria, calcia, ceria, scandia, magnesia, india and mixtures thereof; and 3. one or more of a third metal oxide selected from the group consisting of:
    a. hafnia in an amount from about 0.5 to about 40 mole % of the composition; and
    b. tantala in an amount of from about 0.5 to about 10 mole % of the composition.

Another embodiment of this invention relates to a thermally protected article. This protected article comprises:
A. a substrate;
B. optionally a bond coat layer adjacent to and overlaying the metal substrate; and
C. a thermal barrier coating (prepared from the previously described ceramic composition) adjacent to and overlaying the bond coat layer (or overlaying the substrate if the bond coat layer is absent).

Another embodiment of this invention relates to a method for preparing the thermal barrier coating on a metal substrate to provide a thermally protected article. This method comprises the steps of:
A. optionally forming a bond coat layer on the substrate; and
B. depositing on the bond coat layer (or on the metal substrate in the absence of the bond coat layer) the ceramic composition previously described to form a thermal barrier coating.

The ceramic compositions of this invention provide several benefits when used to provide thermal barrier coatings for substrates, especially metal substrates, of articles exposed to high temperatures, such as turbine components. Thermal barrier coatings can be prepared from these ceramic compositions such that the zirconia is stabilized in the desired cubic phase structure, yet provide reduced thermal conductivity, without needing to include traditional phase stabilizers for zirconia such as yttria. Inclusion of hafnia and/or tantala contributes further reductions in the conductivity of the resultant coating.

BRIEF DESCRIPTION OF THE DRAWING

The FIGURE is a partial side sectional view of an embodiment of the thermal barrier coating and coated article of this invention.

DETAILED DESCRIPTION OF THE INVENTION

As used herein, the term "zirconia-containing ceramic compositions" refers to ceramic compositions where zirconia is the primary component that are useful as thermal barrier coatings that are capable of reducing heat flow to the underlying substrate of the article, i.e., forming a thermal barrier, and which have a melting point that is typically at least about 2600° F. (1426° C.), and more typically in the range of from about 3450° to about 4980° F. (from about 1900° to about 2750° C.).

As used herein, the term "comprising" means various compositions, compounds, components, layers, steps and the like can be conjointly employed in the present invention. Accordingly, the term "comprising" encompasses the more restrictive terms "consisting essentially of" and "consisting of"

All amounts, parts, ratios and percentages used herein are by mole % unless otherwise specified.

The ceramic compositions of this invention impart improved thermal conductivity properties to the resulting thermal barrier coatings, and in particular lower thermal conductivity. Thermal conductivity K is defined by the following equation (1):

$$K = \alpha \times (1-p) \times C_p \times D_t \quad (1)$$

where $\alpha$ is the thermal diffusivity, p is the fraction of porosity, $C_p$ is the specific heat (in J/g*K), and $D_t$ is the theoretical density. As be seen from equation (1) above, thermal conductivity depends on thermal diffusivity and porosity.

The zirconia-containing ceramic compositions of this invention comprise at least about 50 mole % zirconia. Typically, the compositions of this invention comprise from about 50 to about 90 mole % zirconia, more typically from about 60 to about 85 mole % zirconia.

The zirconia-containing compositions of this invention are capable of providing thermal barrier coatings wherein the zirconia is stabilized, typically fully stabilized, in the cubic crystalline phase. To achieve this, these compositions further comprise a stabilizing amount (up to about 49 mole %) of a stabilizer component. The particular amount of the stabilizer component that is "stabilizing" will depend on a variety of factors, including the thermal insulating properties desired, the particular amounts and types of the stabilizer metal oxides used and like factors. Typically, the stabilizer component comprises from about 5 to about 49 mole %, more typically from about from about 10 to about 30 mole %, of the composition.

The stabilizer component at least comprises a first metal oxide selected from the group consisting of ytterbia, neodymia, and mixtures thereof, with or without lanthana, i.e., ytterbia, neodymia, mixtures of ytterbia and neodymia, mixtures of ytterbia and lanthana, mixtures of neodymia and lanthana, and mixtures of ytterbia, neodymia and lanthana. Neodymia has been found to provide the greatest reduction in thermal conductivity as the first metal oxide. Inclusion of ytterbia in the first metal oxide can be desirable because of its higher molecular weight. Inclusion of lanthana in the first metal oxide can create further phonon scattering by effectively increasing lattice strain, provided the amount thereof is relatively low to avoid reducing impact and erosion resistance of the thermal barrier coating. The particular amount of first metal oxide used will depend on a variety of factors, including the thermal insulating properties desired, the particular mixture of first metal oxide(s) used, the stabilizing benefits desired and like factors. The first metal oxide can comprise from about 5 to about 49 mole %, typically from about 10 to about 40 mole %, more typically from about 10 to about 30 mole %, of the ceramic composition. When included as part of the first metal oxide, lanthana typically comprises from about 1 to about 10 mole %, more typically from about 2 to about 8 mole %, of the composition.

The stabilizer component of the ceramic compositions of this invention can also optionally comprise a second metal oxide selected from the group consisting of yttria, calcia, ceria, scandia, magnesia, india and mixtures thereof. This second metal oxide, such as yttria, is one that has been traditionally used to chemically phase-stabilize zirconia-containing ceramic compositions. Typically, this second metal oxide comprises about 4 mole % or less, more typically about 2 mole % or less, of the composition. It has been discovered that the zirconia-containing ceramic compositions of this invention can provide thermal barrier coatings stabilized in the desired cubic crystalline phase without needing to include traditional stabilizers, and in particular traditional stabilizer metal oxides such as yttria, calcia, ceria, scandia, magnesia, or india. Accordingly, the zirconia-containing ceramic compositions can be substantially free of the second metal oxide, i.e., the second metal oxide can comprise about 0.1 mole % or less of the composition.

The zirconia-containing ceramic compositions of this invention also comprise one or more third metal oxides selected from the group consisting of hafnia and tantala, i.e., tantalum oxide. Inclusion of hafnia decreases the $C_p$ of the composition without significantly influencing its stability, thus effectively balancing the thermal conductivity when the zirconia lattice stability is fixed by the stabilizer metal oxide, i.e., the first metal oxide, with or without the second metal oxide. Hafnia inclusion also reduces surface diffusion in the zirconia-containing thermal barrier coating structure during the deposition process, such as physical vapor deposition, used to prepare the thermal barrier coating, as well as during subsequent engine operation due to the lower diffusion rates of hafnia. This results in a more "feathery" structure of the as-deposited coating that contributes to reduced conductivity through increased porosity and reduced density. Inclusion of hafnia also maintains the reduced conductivity of the thermal barrier coating after thermal exposure due to better sintering resistance. Inclusion of tantala provides oxygen interstitial defects and phonon scattering by mass difference, thus effectively influencing the stability level in the direction opposite that of the other metal oxides, i.e., the first and second metal oxides, while contributing a reduction or lowering of thermal conductivity of the thermal barrier coating.

The particular amount of hafnia and/or tantala included will depend on a variety of factors, including the thermal insulating properties desired, the amounts and types of first metal oxide(s) used and like factors. Typically, hafnia is included in an amount of from about 0.5 to about 40 mole %, more typically from about 5 to about 25 mole %, of the ceramic composition. Typically, tantala is included in an amount of from about 0.5 to about 10 mole %, more typically from about 2 to about 8 mole %, of the ceramic composition.

The ceramic compositions of this invention having lower thermal conductivity properties are based on the discovery that, to achieve any further reduction in thermal conductivity beyond that provided by traditional stabilizer metal oxides (e.g., yttria), a different mechanism needs to be used. This mechanism involves including ytterbia and/or neodymia, with or without lanthana, in the stabilizer component, along with hafnia and/or tantala in these zirconia-containing ceramic compositions. Inclusion of ytterbia and/or neodymia, with or without lanthana, in the stabilizer component, along with hafnia and/or tantala in these ceramic compositions, imparts significant benefits to the resulting thermal barrier coating, including one or more of the following: (a) adding atoms of atomic weight higher than zirconium (especially ytterbium, hafnium and tantalum) and typically greater than the atomic weight of the metal atom of the second metal oxide (e.g., yttrium) to introduce effective phonon scattering sites and reduce the specific heat of the coating; (b) adding atoms of ionic radius different from zirconium (especially lanthanum and neodymium) and typically with an ionic radius greater than that of the metal atom of the second metal oxide (e.g., yttrium) such that the resultant lattice strain introduces phonon scattering sites (i.e., to reduce the phonon mean free path); (c) and adding metal oxides of different valence from zirconia (especially metal oxides of trivalent metal ions such as ytterbia, neodymia, lanthana and yttria and metal oxides of pentavalent metal ions such as tantala) to introduce oxygen defects at a controlled level, thus creating another phonon scattering mechanism; and (d) producing a different crystal structure in the thermal barrier coating, i.e., the cubic crystalline phase, instead of the traditional tetragonal crystalline phase.

Thermal barrier coatings prepared from the ceramic compositions of this invention are useful with a wide variety of turbine engine (e.g., gas turbine engine) parts and components that are formed from substrates, typically metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, turbine nozzles, combustor components such as liners and deflectors, augmentor hardware of gas turbine engines and the like. The thermal barrier coatings of this invention can also cover a portion or all of the metal substrate. For example, with regard to airfoils such as blades, the thermal barrier coatings of this invention are typically used to protect, cover or overlay portions of the metal substrate of the airfoil rather than the entire component, e.g., the thermal barrier coatings cover the leading and trailing edges and other surfaces of the airfoil, but not the attachment area. While the following discussion of the thermal barrier coatings of this invention will be with reference to metal substrates of turbine engine parts and components, it should also be understood that the thermal barrier coatings of this invention are useful with metal substrates of other articles that operate at, or are exposed to, high temperatures, as well as high temperature composite substrates.

The various embodiments of the thermal barrier coatings of this invention are further illustrated by reference to the drawings as described hereafter. Referring to the drawing, the FIGURE shows a partial side sectional view of an embodiment of the thermal barrier coating used with the metal substrate of an article indicated generally as 10. As shown in the FIGURE, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417-479 (1980), and Vol. 15, pp. 787-800 (1981). Illustrative high temperature nickel-based alloys are designated by the trade names Inconel®, Nimonic®, Rene® (e.g., Rene® 80, Rene(t N5 alloys), and Udimet®. As described above, the type of substrate 14 can vary widely, but it is representatively in the form of a turbine part or component, such as an airfoil (e.g., blade) or turbine shroud.

As shown in the FIGURE, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, or NiAl(Zr) compositions, as well as various noble metal diffusion aluminides such as platinum aluminide, as well as simple aluminides (i.e., those formed without noble metals). This bond coat layer 18 can be applied, deposited or otherwise formed on substrate 10 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and U.S. Pat. No. 6,039,810 (Mantkowski et al), issued Mar. 21, 2000, all of which are incorporated by reference and which disclose various apparatus and methods for applying diffusion aluminide coatings, or combinations of such techniques, such as, for example, a combination of plasma spray and diffusion aluminide techniques. Typically, plasma spray or diffusion techniques are employed to deposit bond coat layer 18. Usually, the deposited bond coat layer 18 has a thickness in the range of from about 1 to about 20 mils (from about 25 to about 508 microns). For bond coat layers 18 deposited by PVD techniques such as EB-PVD or diffusion aluminide processes, the thickness is more typically in the range of from about 1 to about 4 mils (from about 25 to about 102 microns). For bond coat layers deposited by plasma spray techniques such as APS, the thickness is more typically in the range of from about 3 to about 15 mils (from about 76 to about 381 microns).

As shown in the FIGURE, thermal barrier coating (TBC) 22 prepared from the ceramic composition of this invention is adjacent to and overlies bond coat layer 18. The thickness of TBC 22 is typically in the range of from about 1 to about 100 mils (from about 25 to about 2540 microns) and will depend upon a variety of factors, including the article 10 that is involved. For example, for turbine shrouds, TBC 22 is typically thicker and is usually in the range of from about 30 to about 70 mils (from about 762 to about 1788 microns), more typically from about 40 to about 60 mils (from about 1016 to about 1524 microns). By contrast, in the case of turbine blades, TBC 22 is typically thinner and is usually in the range of from about 1 to about 30 mils (from about 25 to about 762 microns), more typically from about 3 to about 20 mils (from about 76 to about 508 microns).

In forming TBCs 22, the ceramic compositions of this invention can be applied, deposited or otherwise formed on bond coat layer 18 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray; chemical vapor deposition (CVD), or combinations of plasma spray and CVD techniques. The particular technique used for applying, depositing or otherwise forming TBC 22 will typically depend on the composition of TBC 22, its thickness and especially the physical structure desired for TBC 22. For example, PVD techniques tend to be useful in forming TBCs having a strain-tolerant columnar structure. By contrast, plasma spray techniques (e.g., APS) tend to create a splat-layered porous structure. TBC 22 is typically formed from ceramic compositions of this invention by PVD, and especially EB-PVD techniques to provide a strain-tolerant columnar structure.

Various types of PVD and especially EB-PVD techniques well known to those skilled in the art can also be utilized to form TBCs 22 from the ceramic compositions of this invention. See, for example, U.S. Pat. No. 5,645,893 (Rickerby et al), issued Jul. 8, 1997 (especially col. 3, lines 36-63); U.S. Pat. No. 5,716,720 (Murphy), issued Feb. 10, 1998) (especially col. 5, lines 24-61) and U.S. Pat. No. 6,447,854 (Rigney et al), issued Sep. 10 2002, which are all incorporated by reference. Suitable EB-PVD techniques for use herein typically involve a coating chamber with a gas (or gas mixture) that preferably includes oxygen and an inert gas, though an oxygen-free coating atmosphere can also be employed. The ceramic coating compositions are then evaporated with electron beams focused on, for example, ingots of the ceramic coating compositions so as to produce a vapor of metal ions, oxygen ions and one or more metal oxides. The metal and oxygen ions and metal oxides recombine to form TBC 22 on the surface of metal substrate 14, or more typically on bond coat layer 18.

Various types of plasma-spray techniques well known to those skilled in the art can also be utilized to form TBCs 22 from the ceramic compositions of this invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The ceramic coating composition, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface, substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the ceramic coating composition particles flowing into the plasma plume (or plasma "jet") is another parameter which is usually controlled very closely.

Suitable plasma spray systems are described in, for example, U.S. Pat. No. 5,047,612 (Savkar et al) issued Sep. 10, 1991, which is incorporated by reference. Briefly, a typical plasma spray system includes a plasma gun anode which has a nozzle pointed in the direction of the deposit-surface of the substrate being coated. The plasma gun is often controlled automatically, e.g., by a robotic mechanism, which is capable of moving the gun in various patterns across the substrate surface. The plasma plume extends in an axial direction between the exit of the plasma gun anode and the substrate surface. Some sort of powder injection means is disposed at a predetermined, desired axial location between the anode and the substrate surface. In some embodiments of such systems, the powder injection means is spaced apart in a radial sense from the plasma plume region, and an injector tube for the powder material is situated in a position so that it can direct the powder into the plasma plume at a desired angle. The powder particles, entrained in a carrier gas, are propelled through the injector and into the plasma plume. The particles are then heated in the plasma and propelled toward the substrate. The particles melt, impact on the substrate, and quickly cool to form the thermal barrier coating.

To improve adherence of TBC 22 to bond coat layer 18, it can be desirable to include an underlying a zirconia-containing layer that is stabilized in the tetragonal crystalline phase. This underlying layer for improving the adherence of TBC 22 to bond coat layer 18 comprises: (1) at least about 80 mole % zirconia; and (2) a stabilizing amount up to about 10 mole % of a stabilizer component. This stabilizer component comprises: (a) a first metal oxide selected from the group consisting of yttria, calcia, ceria, scandia, magnesia, india and mixtures thereof in an amount of from about 1.5 to about 10 mole %; and (b) optionally a second metal oxide selected from the group consisting of lanthana, neodymia, ytterbia and mixtures thereof in an amount of from about 0.5 to about 8.5 mole %. This underlying layer can also optionally comprise: (c) hafnia in an amount of from about 0.5 to about 15 mole %; and/or (d) tantala in an amount from about 0.5 to about 1.5 mole %. Particularly suitable ceramic composition for preparing this underlying layer are disclosed in copending U.S. nonprovisional application entitled "THERMAL BARRIER COATINGS HAVING LOWER LAYER FOR IMPROVED ADHERENCE TO BOND COAT" (Darolia et al), Ser. No. 10/748,519, filed Dec. 30, 2003, which is incorporated by reference.

EXAMPLES

The following illustrates embodiments of thermal barrier coatings of this invention:

Example 1

A thermal barrier coating stabilized in the cubic crystalline phase is prepared by EB-PVD techniques from the following ceramic composition:

TABLE 1

| Metal Oxide | Mole % | Wt. % |
|---|---|---|
| Zirconia | 61 | 40 |
| Ytterbia | 17 | 35 |
| Hafnia | 22 | 25 |

Example 2

A thermal barrier coating stabilized in the cubic crystalline phase is prepared by EB-PVD techniques from the following ceramic composition:

TABLE 2

| Metal Oxide | Mole % | Wt. % |
|---|---|---|
| Zirconia | 61 | 40 |
| Ytterbia | 10 | 20 |
| Neodymia | 11 | 20 |
| Hafnia | 18 | 20 |

Example 3

A thermal barrier coating stabilized in the cubic crystalline phase is prepared by EB-PVD techniques from the following ceramic composition:

TABLE 3

| Metal Oxide | Mole % | Wt. % |
|---|---|---|
| Zirconia | 76 | 54 |
| Ytterbia | 13 | 30 |
| Lanthana | 3 | 6 |
| Hafnia | 8 | 10 |

Example 4

A thermal barrier coating stabilized in the cubic crystalline phase is prepared by EB-PVD techniques from the following ceramic composition:

TABLE 4

| Metal Oxide | Mole % | Wt. % |
|---|---|---|
| Zirconia | 83 | 63.5 |
| Ytterbia | 12 | 29.5 |
| Hafnia | 5 | 7 |

Example 5

A thermal barrier coating stabilized in the cubic crystalline phase is prepared by EB-PVD techniques from the following ceramic composition:

TABLE 5

| Metal Oxide | Mole % | Wt. % |
|---|---|---|
| Zirconia | 59.5 | 35 |
| Neodymia | 40 | 64.5 |
| Hafnia | 0.5 | 0.5 |

Example 6

The adherence of the thermal barrier coatings of any of Examples 1 to 5 can improved by first forming on the bond coat layer an underlying zirconia-containing layer stabilized in the tetragonal crystalline phase that is prepared by EB-PVD techniques from any of the following ceramic compositions:

TABLE 6

| Metal Oxide | Mole % | Wt. % |
|---|---|---|
| Zirconia | 93.7 | 86.7 |
| Yttria | 1.5 | 2.5 |
| Ytterbia | 1.9 | 5.8 |
| Lanthana | 0.5 | 1.5 |
| Hafnia | 2.2 | 3.5 |

TABLE 7

| Metal Oxide | Mole % | Wt. % |
|---|---|---|
| Zirconia | 92.2 | 85.0 |
| Yttria | 1.8 | 3.0 |
| Ytterbia | 1.0 | 3.0 |
| Lanthana | 1.2 | 3.0 |
| Hafnia | 3.8 | 6.0 |

TABLE 8

| Metal Oxide | Mole % | Wt. % |
|---|---|---|
| Zirconia | 94.1 | 87.8 |
| Yttria | 4.1 | 7.0 |
| Ytterbia | 1.8 | 5.2 |

TABLE 9

| Metal Oxide | Mole % | Wt. % |
|---|---|---|
| Zirconia | 94.0 | 88.4 |
| Yttria | 4.1 | 7.0 |
| Lanthana | 1.9 | 4.6 |

While specific embodiments of this invention have been described, it will be apparent to those skilled in the art that various modifications thereto can be made without departing from the spirit and scope of this invention as defined in the appended claims.

What is claimed is:

1. A zirconia-containing ceramic composition capable of providing a thermal barrier coating wherein the zirconia is stabilized in the cubic crystalline phase, and which consists of:
   1. from about 50 to about 90 mole % zirconia; and
   2. a stabilizing amount of from about 5 to about 49 mole % of a stabilizer component comprising:
      a. a first metal oxide selected from the group consisting of ytterbia, neodymia, mixtures of ytterbia and neodymia, mixtures of ytterbia and lanthana, mixtures of neodymia and lanthana, and mixtures of ytterbia, neodymia and lanthana in an amount of from about 5 to about 49 mole % of the composition; and
   3. one or more of a metal oxide selected from the group consisting of:
      a. hafnia in an amount from about 0.5 to about 40 mole % of the composition; and
      b. tantala in an amount of from about 0.5 to about 10 mole % of the composition.

2. The composition of claim 1 which comprises from about 60 to about 85 mole % zirconia and from about 10 to about 30 mole % stabilizer component.

3. The composition of claim 2 which comprises from about 5 to about 25 mole % hafnia.

4. The composition of claim 2 which comprises from about 2 to about 8 mole % tantala.

5. The composition of claim 2 wherein the first metal oxide is selected from the group consisting of mixtures of neodymia and lanthana, mixtures of ytterbia and lanthana, and mixtures of ytterbia, neodymia and lanthana, wherein the lanthana is included in the mixtures in an amount of from about 1to about 10 mole % of the composition.

6. The composition of claim 5 wherein lanthana is included in the mixtures in an amount of from about 2 to about 8 mole % of the composition.

7. The composition of claim 2 wherein the first metal oxide is neodymia.

8. The composition of claim 1 wherein the stabilizer component comprises the first metal oxide in an amount of from about 10 to about 40 mole % of the composition.

9. The zirconia-containing ceramic composition according to claim 1 consisting of:
   from about 59 to about 85 mole % zirconia;
   from about 10 to about 40 mole % ofthe first metal oxide;
   from about 0.5 to about 22 mole % hafnia; and
   optionally, from about 0.5 to about 10 mole % tantala.

10. The zirconia-containing ceramic composition according to claim 9 wherein the first metal oxide includes lanthana in an amount of from about 2 to about 8 mole % of the composition.

11. The zirconia-containing composition according to claim 9 wherein tantala is present in an amount of from about 2 to about 8 mole % of the composition.

12. A thermally protected article, which comprises:
   A. a substrate; and
   B. a thermal barrier coating that is stabilized in the cubic crystalline phase, and which consists of:
      1. from about 50 to about 90 mole % zirconia; and
      2. a stabilizing amount of from about 5 to about 49 mole % of a stabilizer component comprising:
         a first metal oxide selected from the group consisting of ytterbia, neodymia, mixtures of ytterbia and neodymia, mixtures of ytterbia and lanthana, mixtures of neodymia and lanthana, and mixtures of ytterbia, neodymia and lanthana in an amount of from about 5 to about 49 mole % of the thermal barrier coating; and
      3. one or more of a metal oxide selected from the group consisting of:
         a. hafnia in an amount from about 0.5 to about 40 mole % of the thermal barrier coating; and
         b. tantala in an amount of from about 0.5 to about 10 mole % of the thermal barrier coating.

13. The article of claim 12 wherein the substrate is a metal substrate, wherein the article further comprises a bond coat layer adjacent to and overlaying the metal substrate and wherein the thermal barrier coating is adjacent to and overlies the bond coat layer.

14. The article of claim 13 wherein the thermal barrier coating has a thickness of from about 1 to about 100 mils.

15. The article of claim 14 wherein the thermal barrier coating has a strain-tolerant columnar structure.

16. The article of claim 12 wherein the thermal barrier coating comprises from about 60 to about 85 mole % zirconia; and from about 10 to about 30 mole % stabilizer component.

17. The article of claim 16 wherein the thermal barrier coating comprises from about 2 to about 8 mole % tantala.

18. The article of claim 16 wherein the first metal oxide is selected from the group consisting of mixtures of neodymia and lanthana, mixtures of ytterbia and lanthana, and mixtures of ytterbia, neodymia and lanthana, wherein the lanthana is included in the mixtures in an amount of from about 1 to about 10 mole % of the thermal barrier coating.

19. The article of claim 18 wherein lanthana is included in the mixtures in an amount of from about 2 to about 8 mole % of the thermal barrier coating.

20. The article of claim 12 wherein the stabilizer component comprises the first metal oxide in an amount of from about 10 to about 40 mole % of the thermal barrier coating.

21. The article of claim 12 wherein the first metal oxide is neodymia.

22. The article of claim 12 which is a turbine engine component.

23. The article of claim 22 which is a turbine shroud and wherein the thermal barrier coating has a thickness of from about 30 to about 70 mils.

24. The article of claim 22 which is a turbine airfoil and wherein the thermal barrier coating has a thickness of from about 3 to about 15 mils.

25. The thermally protected article according to claim 12 wherein the thermal barrier coating consists of:

from about 59 to about 85 mole % zirconia;
from about 10 to about 40 mole % of the first metal oxide; and
from about 0.5 to about 22 mole % hafnia; and
optionally, from about 0.5 to about 10 mole % tantala.

26. The thermally protected article according to claim 25 wherein in the thermal barrier coating, the first metal oxide includes lanthana in an amount of from about 2 to about 8 mole %.

27. The thermally protected article according to claim 25 wherein tantala is present in the thermal barrier coating in an amount of from about 2 to about 8 mole %.

* * * * *